US009690414B2

(12) United States Patent
Kano et al.

(10) Patent No.: US 9,690,414 B2
(45) Date of Patent: Jun. 27, 2017

(54) TOUCH SENSOR HAVING A PRESSURE DETECTING SENSOR WITH AN ELECTRODE NON-FORMING SECTION

(71) Applicant: Murata Manufacturing Co., Ltd., Nagaokakyo-shi, Kyoto-fu (JP)

(72) Inventors: Hidekazu Kano, Nagaokakyo (JP); Jun Endo, Nagaokakyo (JP); Takafumi Inoue, Nagaokakyo (JP); Hiroaki Kitada, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 63 days.

(21) Appl. No.: 14/844,453

(22) Filed: Sep. 3, 2015

(65) Prior Publication Data

US 2015/0378493 A1    Dec. 31, 2015

Related U.S. Application Data

(63) Continuation of application No. PCT/JP2014/075988, filed on Sep. 30, 2014.

(30) Foreign Application Priority Data

Oct. 4, 2013  (JP) .................................. 2013-208986

(51) Int. Cl.
*G06F 3/041* (2006.01)
*G06F 3/044* (2006.01)
(Continued)

(52) U.S. Cl.
CPC .............. *G06F 3/0414* (2013.01); *G01L 1/16* (2013.01); *G06F 3/044* (2013.01); *H01L 41/1132* (2013.01); *G06F 2203/04106* (2013.01)

(58) Field of Classification Search
CPC .......... G06F 3/045; G06F 3/044; G06F 3/041; G01R 27/26; G06K 11/06; G08C 21/00;
(Continued)

(56) References Cited

U.S. PATENT DOCUMENTS

2009/0079442 A1* 3/2009 Gabl .................. G01N 29/2437
324/663
2009/0231395 A1* 9/2009 Tsukamoto .......... B41J 2/04581
347/70
(Continued)

FOREIGN PATENT DOCUMENTS

JP     H05-61592 A    3/1993
JP     2010-108490 A  5/2010
(Continued)

OTHER PUBLICATIONS

International Search Report for PCT/JP2014/075988, date of mailing Dec. 22, 2014.
Written Opinion of the International Searching Authority for PCT/JP2014/075988, date of mailing Dec. 22, 2014.

*Primary Examiner* — Pegeman Karimi
(74) *Attorney, Agent, or Firm* — Arent Fox LLP

(57) ABSTRACT

A touch sensor that includes a pressure detection sensor and a position detection sensor. The pressure detection sensor includes a piezoelectric film, a first piezoelectricity detecting electrode adjacent a first principal surface of the piezoelectric film, and a second piezoelectricity detecting electrode adjacent a second principal surface of the piezoelectric film. The position detection sensor includes a dielectric substrate, a plurality of first position detecting electrodes adjacent a first principal surface of the dielectric substrate, and a plurality of second position detecting electrodes adjacent a second principal surface of the dielectric substrate. In the pressure detection sensor, the second piezoelectricity detecting electrode includes an electrode non-forming section in a
(Continued)

region where the first position detecting electrode and the second position detecting electrode overlap each other.

12 Claims, 4 Drawing Sheets

(51) Int. Cl.
*G01L 1/16* (2006.01)
*H01L 41/113* (2006.01)

(58) Field of Classification Search
CPC ......... B32B 37/00; B32B 38/10; B29C 65/00; B31D 1/02; H02N 11/00; H02N 2/00; H01L 41/00
See application file for complete search history.

(56) References Cited

U.S. PATENT DOCUMENTS

| | | | |
|---|---|---|---|
| 2012/0075221 A1* | 3/2012 | Yasuda | B32B 37/02 345/173 |
| 2013/0082970 A1* | 4/2013 | Frey | G06F 3/0414 345/173 |
| 2014/0152618 A1 | 6/2014 | Ando | |
| 2014/0347304 A1 | 11/2014 | Ando | |
| 2016/0099403 A1 | 4/2016 | Tanimoto et al. | |

FOREIGN PATENT DOCUMENTS

| | | |
|---|---|---|
| WO | WO 2014168188 A1 | 10/2014 |
| WO | WO 2013/021835 A1 | 3/2015 |
| WO | WO 2013/122070 A1 | 5/2015 |

\* cited by examiner

TOUCH SENSOR HAVING A PRESSURE DETECTING SENSOR WITH AN ELECTRODE NON-FORMING SECTION

CROSS REFERENCE TO RELATED APPLICATIONS

The present application is a continuation of International application No. PCT/JP2014/075988, filed Sep. 30, 2014, which claims priority to Japanese Patent Application No. 2013-208986, filed Oct. 4, 2013, the entire contents of each of which are incorporated herein by reference.

FIELD OF THE INVENTION

The present invention relates to a touch sensor that detects a touch position on an operation surface and detects push-in on the operation surface.

BACKGROUND OF THE INVENTION

Conventionally, there have been proposed various touch type input devices that detect operation input by an operator touching on an operation surface. Some touch type input devices detect a touch position in the operation surface and push-in of the operation surface or a pressing force of the push-in.

For example, a touch type input device disclosed in Patent document 1 has a structure in which a flat pressure sensor (pressure detection sensor) and a flat electrostatic type position detection sensor overlap each other. The pressure detection sensor detects the push-in and the pressing force, and the electrostatic type position detection sensor detects the operation position.

The electrostatic type position detection sensor includes a dielectric substrate and position detecting electrodes that are arrayed on the dielectric substrate in a two-dimensional matrix shape. The position detecting electrodes are arranged on both principal surfaces of the dielectric substrate. The pressure detection sensor includes a piezoelectric material and piezoelectricity detecting electrodes that detect a charge generated by the piezoelectric material. The piezoelectricity detecting electrodes are arranged on both principal surfaces of the piezoelectric material.

Patent document 1: Unexamined Japanese Patent Publication No. 5-61592

SUMMARY OF THE INVENTION

As described above, for the touch sensor including the electrostatic type position detection sensor and the pressure detection sensor, light incident from a rear surface side of the touch sensor is output to a display surface that is of the operation surface through at least the piezoelectricity detecting electrode on the rear surface side of the pressure detection sensor, the piezoelectric material, the piezoelectricity detecting electrode on the surface side of the pressure detection sensor, the position detecting electrode on the rear surface side of the electrostatic type position detection sensor, the dielectric substrate, and the position detecting electrode on the surface side of the electrostatic type position detection sensor.

Therefore, sometimes light transmittance of the touch sensor degrades even if individual components have high light transmittance.

An object of the present invention is to provide a touch sensor having light transmittance higher than that of the conventional configuration.

A touch sensor of the present invention includes a pressure detection sensor and an electrostatic type position detection sensor. The pressure detection sensor includes a piezoelectric film including a first surface and a second surface, the first surface and the second surface being orthogonal to a thickness direction, a first piezoelectricity detecting electrode arranged on the first surface, and a second piezoelectricity detecting electrode arranged on the second surface. The electrostatic type position detection sensor includes a dielectric substrate including a third surface and a fourth surface, the third surface and the fourth surface being orthogonal to the thickness direction, a first position detecting electrode arranged on the third surface, and a second position detecting electrode arranged on the fourth surface.

The pressure detection sensor and the electrostatic type position detection sensor are arranged such that the first surface and the second surface are parallel to the third surface and the fourth surface. The first piezoelectricity detecting electrode is arranged over a substantially whole surface of the first surface. The second piezoelectricity detecting electrode includes an electrode non-forming section at a position where the first position detecting electrode and the second position detecting electrode overlap each other when the pressure detection sensor and the electrostatic type position detection sensor are viewed in the thickness direction.

In the configuration, the first and second position detecting electrodes overlap the first piezoelectricity detecting electrode in the thickness direction in the region where the first position detecting electrode overlaps the second position detecting electrode. On the other hand, the first position detecting electrode or the second position detecting electrode overlaps the first and the second piezoelectricity detecting electrodes in the thickness direction in the region where the first position detecting electrode does not overlap the second position detecting electrode. When viewed from the operation surface constituting the principal surface of the touch sensor, the electrodes have a three-layer structure in the whole region where the electrode is formed, and the number of layers is decreased compared with a conventional four-layer structure. Therefore, the light transmittance of the touch sensor is improved.

In the touch sensor, preferably the electrode non-forming section includes a region that overlaps a region where the second position detecting electrode is arranged when the pressure detection sensor and the electrostatic type position detection sensor are viewed in the thickness direction.

In the configuration, the second piezoelectricity detecting electrode does not exist in the region where the second position detecting electrode is arranged, so that the light transmittance can be improved in the region where the second position detecting electrode is arranged.

In the touch sensor, preferably the electrode non-forming section includes a region that overlaps at least a part of a region where the first position detecting electrode is arranged when the pressure detection sensor and the electrostatic type position detection sensor are viewed in the thickness direction.

In the configuration, the second piezoelectricity detecting electrode does not exist in a part of the region where the electrode non-forming section overlaps the first position detecting electrode, so that the light transmittance can be improved in the part of the region where the first position detecting electrode is arranged.

In the touch sensor, preferably, in the first position detecting electrode, when the electrostatic type position detection sensor is viewed in the thickness direction, the width of the region that overlaps the second position detecting electrode is smaller than the width of the region that does not overlap the second position detecting electrode.

In the configuration, an overlapping area of the first position detecting electrode and the second position detecting electrode is reduced, so that translucency can be improved.

In the touch sensor, the first piezoelectricity detecting electrode is formed on the first surface of the piezoelectric film with a translucent hard-coat layer interposed therebetween.

In the configuration, a base film on which the first piezoelectricity detecting electrode is formed and an adhesive that bonds the base film to the piezoelectric film are replaced with one translucent hard-coat layer. Therefore, the translucency of the pressure detection sensor can be improved. The pressure detection sensor can be thinned. Therefore, the low-profile touch sensor having the high translucency can be made.

In the touch sensor, preferably the piezoelectric film is made of polylactic acid stretched in a uniaxial direction.

In the configuration, the touch sensor has high translucency, and sensitivity of pressure detection can be improved.

The present invention can make the touch sensor having light transmittance higher than that of the conventional configuration.

DETAILED DESCRIPTION OF THE INVENTION

Figure 1:
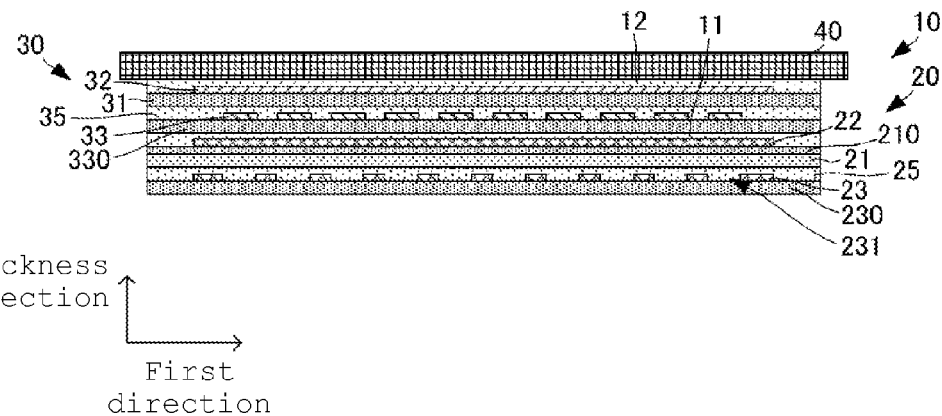
FIG. 1 is a sectional side view illustrating a configuration of a touch sensor according to a first embodiment of the present invention.
Figure 2:
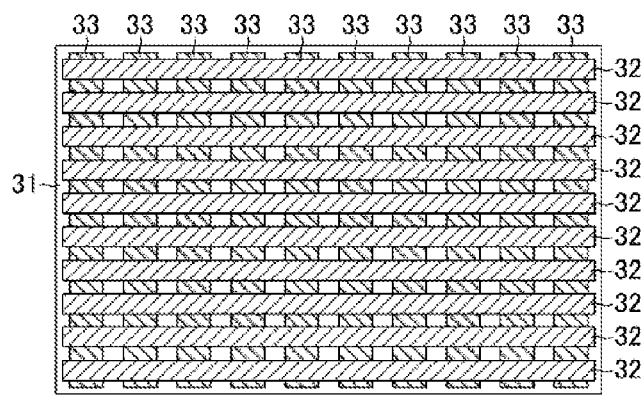
FIG. 2 shows plan views illustrating an electrode pattern in each layer of the touch sensor according to the first embodiment of the present invention.
Figure 2:
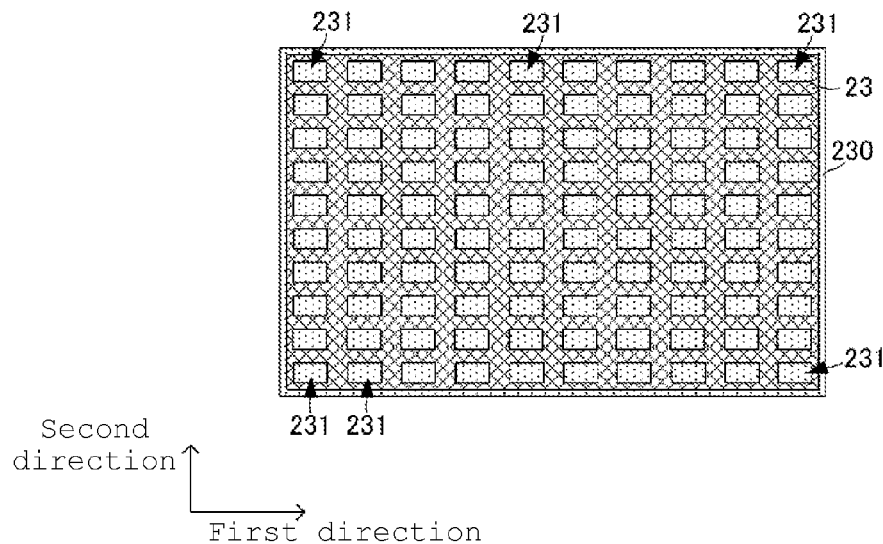
Figure 3:
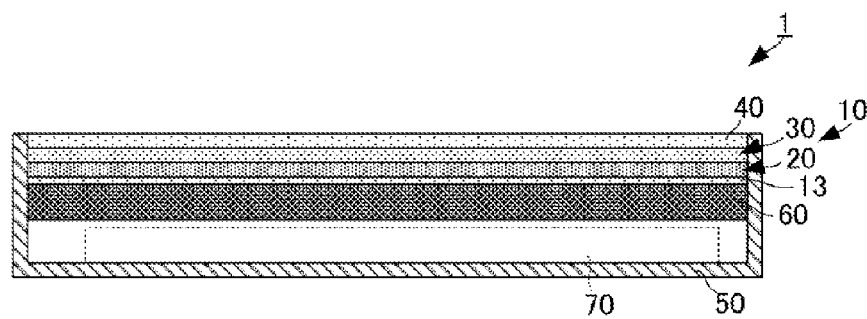
FIG. 3 is a sectional side view illustrating a configuration of a touch type input device provided with the touch sensor according to the first embodiment of the present invention.
Figure 3:
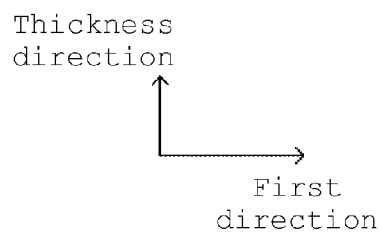

Hereinafter, a touch sensor according to a first embodiment of the present invention will be described with reference to the drawings. FIG. 1 is a sectional side view illustrating a configuration of the touch sensor according to the first embodiment of the present invention. FIG. 2 shows plan views illustrating an electrode pattern in each layer of the touch sensor according to the first embodiment of the present invention. FIG. 3 is a sectional side view illustrating a configuration of a touch type input device provided with the touch sensor according to the first embodiment of the present invention. Only schematic shapes of a pressure detection sensor and a position detection sensor, which constitute the touch sensor, are illustrated in FIG. 3.

As illustrated in FIGS. 1 and 2, a touch sensor 10 includes a pressure detection sensor 20 and a position detection sensor 30. The pressure detection sensor 20 and the position detection sensor 30 have a rectangular flat shape in a planar view. The pressure detection sensor 20 and the position detection sensor 30 are stacked on each other such that principal surfaces of the sensors 20 and 30 are parallel to each other. The touch sensor 10 is attached onto a rear surface side of a cover member 40. The cover member 40 is made of a glass plate or an acrylic plate, and has light transmittance and an insulating characteristic. A surface of the cover member 40 is an operation surface and a display surface of a display image.

The position detection sensor 30 and the pressure detection sensor 20 are arranged in this order from a side of the cover member 40. The cover member 40 and the position detection sensor 30 are bonded to each other by a translucent adhesive 12, and the position detection sensor 30 and the pressure detection sensor 20 are bonded to each other by a translucent adhesive 11. For example, the adhesives 11 and 12 are made of an acrylic adhesive.

The touch sensor 10 having the above configuration is incorporated as a part of a touch type input device 1 as illustrated in FIG. 3. The touch type input device 1 includes a chassis 50 having a substantially rectangular parallelepiped shape. A surface side of the chassis 50 is opened. The touch sensor 10 (a laminated body of the pressure detection sensor 20 and the position detection sensor 30), the cover member 40, a display panel 60, and an arithmetic circuit module 70 that configures a controller are arranged in the chassis 50. The cover member 40, the touch panel 10, the display panel 60, and the arithmetic circuit module 70 are arranged along a thickness direction in the order from an opening (the operation surface and the display surface) side of the chassis 50. The display panel 60 is constructed with a thin display such as a liquid crystal panel and an organic EL panel. The arithmetic circuit module 70 calculates an operation position and a pressing force from detection signals output from the pressure detection sensor 20 and the position detection sensor 30.

A specific configuration of the touch panel 10 will be described below.

The pressure detection sensor 20 of the touch panel 10 includes a piezoelectric film 21, a first piezoelectricity detecting electrode 22, and a second piezoelectricity detecting electrode 23. The piezoelectric film 21 is a rectangular film made of a chiral polymer. In the embodiment, polylactic acid (PLA), particularly poly-L-lactic acid (PLLA) is used as the chiral polymer. PLLA is stretched in a uniaxial direction. A uniaxially-stretching direction forms about 45° with respect to two sides (sides in first and second directions) that are orthogonal to each other to constitute a rectangle. An angle formed by the uniaxially-stretching direction may properly be adjusted, and the angle of 45° is most favorably formed when only both ends in the first or second direction of the touch sensor 10 are fixed to the chassis 50 or when the touch sensor 10 is fixed along an outer periphery.

A main chain of PLLA that is of the chiral polymer has a helical structure. When PLLA is stretched in the uniaxial direction to orient molecules, PLLA has piezoelectricity. The uniaxially-stretched PLLA generates a charge by pressing in a flat plate surface of the piezoelectric film. At this point, the generated charge amount depends on a displacement amount of the flat plate surface that is displaced in a direction orthogonal to the flat plate surface by a press amount (push-in amount). A piezoelectric constant of the uniaxially-stretched PLLA falls into a category of extremely high piezoelectric constant in polymers. Accordingly, the displacement caused by the press can be detected with high sensitivity using PLLA as the piezoelectric film 21.

Preferably a stretching ratio ranges from about 3 times to about 8 times. When a heat treatment is performed after the stretching, crystallization of an extended chain crystal of polylactic acid is promoted to improve the piezoelectric constant. For biaxial stretching, an effect similar to that of the uniaxial stretching can be obtained by varying the stretching ratio in each axis. For example, when the stretching ratio of 8 times is set to a first axial direction while the stretching ratio of 2 times is set to a second axial direction orthogonal to the first axial direction, the effect similar to that of the uniaxial stretching in which the stretching ratio of 4 times is set to the first axial direction is obtained with respect to the piezoelectric constant. That is, the uniaxially-stretching direction means the most stretched direction including the case that the piezoelectric film is stretched in a plurality of directions. Because the simply uniaxially-stretched film tears easily along the stretching-axis direction, strength can be increased to a certain degree by biaxial stretching.

In PLLA, the piezoelectricity is generated by a molecule orientation process such as the stretching, but it is not necessary to perform a polarization process unlike other polymers such as PVDF and other piezoelectric ceramics. The piezoelectricity of PLLA that does not belong to a ferroelectric material is not developed by ion polarization unlike ferroelectric materials such as PVDF and PZT. Therefore, pyroelectricity that is generated in ferroelectric materials such as PVDF and PZT is not generated in PLLA. Furthermore, the piezoelectric constant of PLLA is extremely stable over time, although in PVDF and the like, a variation in piezoelectric constant is observed over time, and sometimes the piezoelectric constant decreases markedly. Accordingly, irrespective of a surrounding environment, the displacement caused by the press can be detected with high sensitivity.

PLLA is an organic piezoelectric material having the high translucency. Accordingly, translucency of the piezoelectric film 21 can be enhanced.

The first piezoelectricity detecting electrode 22 is arranged in a first principal surface of the piezoelectric film 21. The first principal surface of the piezoelectric film 21 is a surface located on the side of the position detection sensor 30 of the piezoelectric film 21. More specifically, a thin, highly-translucent hard-coat layer 210 is formed on the first principal surface of the piezoelectric film 21, and the first piezoelectricity detecting electrode 22 is formed on the surface of the hard-coat layer 210. The hard-coat layer 210 is made of a material having the insulating characteristic and rigidity higher than that of the piezoelectric film 21.

The first piezoelectricity detecting electrode 22 is formed over the substantially whole first principal surface of the piezoelectric film 21. Either an inorganic electrode such as ITO, ZnO, a silver nanowire, a carbon nanotube, and graphene or an organic electrode mainly containing polythiophene, polyaniline, and the like may be used as the first piezoelectricity detecting electrode 22. The use of such materials can form an electrode having high translucency.

In the configuration, the hard-coat layer 210 is formed on the first principal surface of the piezoelectric film 21, which allows an anisotropic conductive film to be connected by thermo-compression bonding when the first piezoelectricity detecting electrode 22 formed on the surface of the hard-coat layer 210 is connected to an external circuit.

Accordingly, the translucency can be improved compared with the conventional configuration in which the heat-resistant insulating base film, on which the first piezoelectricity detecting electrode is formed, is bonded to the piezoelectric film using the adhesive. The structure in which the first piezoelectricity detecting electrode is arranged on the first principal surface of the piezoelectric film can be thinned compared with the conventional structure.

The second piezoelectricity detecting electrode 23 is arranged on the second principal surface side of the piezoelectric film 21. The second principal surface of the piezoelectric film 21 is a surface located on the opposite side to the first principal surface of the piezoelectric film 21, namely, a surface on the opposite side to the position detection sensor 30. More specifically, the second piezoelectricity detecting electrode 23 is formed in an insulating base film 230. The insulating base film 230 is made of a material having the translucency. The insulating base film 230 is bonded to the second principal surface of the piezoelectric film 21 using an adhesive 25 such that the surface on the side on which the second piezoelectricity detecting electrode 23 is formed is on the side of the piezoelectric film 21.

The second piezoelectricity detecting electrode 23 is arranged over the substantially whole second principal surface of the piezoelectric film 21. Although specific shape and array pattern are described later, the second piezoelectricity detecting electrode 23 includes a plurality of electrode non-forming sections 231 as illustrated in FIG. 2. Either an inorganic electrode such as ITO, ZnO, a silver nanowire, a carbon nanotube, and graphene or an organic electrode mainly containing polythiophene, polyaniline, and the like may be used as the second piezoelectricity detecting electrode 23. The use of such materials can form an electrode having high translucency.

In this configuration, the piezoelectric film 21 is distorted to generate a charge when the cover member 40 is pushed in to apply a stress to the piezoelectric film 21. The first piezoelectricity detecting electrode 22 and the second piezoelectricity detecting electrode 23 detect the charge to generate a detection voltage signal, which allows the detection of the pressing force.

The position detection sensor 30 includes a dielectric substrate 31, a first position detecting electrode 32, and a second position detecting electrode 33. The dielectric substrate 31 is made of a rectangular insulating material having translucency.

The first position detecting electrode 32 has an elongated shape, and is arranged on the first principal surface (corresponding to the third principal surface) of the dielectric substrate 31 such that an elongated direction of the first position detecting electrode 32 is parallel to a first direction of the dielectric substrate 31 (touch sensor 10). The first principal surface (corresponding to the third principal surface) of the dielectric substrate 31 is a surface located on the side of the cover member 40 in the dielectric substrate 31.

The plurality of first position detecting electrodes 32 are arranged at intervals along a second direction of the dielectric substrate 31 (touch sensor 10). The first position detecting electrode 32 is directly formed on the first principal surface (corresponding to the third principal surface) of the dielectric substrate 31.

The second position detecting electrode 33 has an elongated shape, and is arranged on the second principal surface (corresponding to the fourth principal surface) of the dielectric substrate 31 such that the elongated direction of the second position detecting electrode 33 is parallel to a second direction of the dielectric substrate 31 (touch sensor 10). The second principal surface (corresponding to the fourth principal surface) of the dielectric substrate 31 is a surface located on the side of the pressure detection sensor 20 in the dielectric substrate 31. The plurality of second position detecting electrodes 33 are arranged at intervals along the first direction of the dielectric substrate 31 (touch sensor 10). More specifically, the second position detecting electrode 33 is formed in an insulating base film 330. The insulating base film 330 is made of a material having translucency. The insulating base film 330 is bonded to the second principal surface (corresponding to the fourth principal surface) of the dielectric substrate 31 using an adhesive 35 such that the surface on the side on which the second position detecting electrode 33 is formed is on the side of the dielectric substrate 31.

The first and second position detecting electrodes 32 and 33 are made of a translucent material such as ITO. Therefore, the position detection sensor 30 having translucency can be made.

In this configuration, a user's finger touches or comes close to the operation surface to change an electrostatic capacitance, which changes an electrostatic capacitance between the first and second position detecting electrodes 32 and 33. At this point, the electrostatic capacitance most largely changes in a region where the first and second position detecting electrodes 32 and 33 located closest to the finger face each other. Accordingly, the operation position can be detected by detecting a combination of the first and second position detecting electrodes 32 and 33 in the region where the largest change in electrostatic capacitance is generated.

In the position detection sensor 30 having the above configuration, the first position detecting electrode 32 has the elongated shape extending in parallel with the second direction, the second position detecting electrode 33 has the elongated shape extending in parallel with the first direction, whereby the first position detecting electrode 32 and the second position detecting electrode 33 partially overlap each other as illustrated in FIGS. 1 and 2 when the touch sensor 10 is viewed in the thickness direction.

The electrode non-forming section 231 provided in the second piezoelectricity detecting electrode 23 is provided in a region (position-detecting-electrode overlapping region) where the first position detecting electrode 31 and the second position detecting electrode 32 overlap each other when the touch sensor 10 is viewed in the thickness direction.

In the position-detecting-electrode overlapping region, the first position detecting electrode 32 and the second position detecting electrode 33 overlap not the second piezoelectricity detecting electrode 23, but the first piezoelectricity detecting electrode 22 in the thickness direction. That is, in the position-detecting-electrode overlapping region, the electrodes have a three-layer structure in the thickness direction.

The first position detecting electrode 32, the first piezoelectricity detecting electrode 22, and the second piezoelectricity detecting electrode 23 overlap one another in the thickness direction in the region where the first position detecting electrode 32 exists while the first position detecting electrode 32 and the second position detecting electrode 33 do not overlap each other.

The second position detecting electrode 33, the first piezoelectricity detecting electrode 22, and the second piezoelectricity detecting electrode 23 overlap one another in the thickness direction in the region where the second position detecting electrode 33 exists while the first position detecting electrode 32 and the second position detecting electrode 33 do not overlap each other.

Thus, in the region where the first position detecting electrode 32 and the second position detecting electrode 33 do not overlap each other, the electrodes have the three-layer structure in the thickness direction.

When the configuration of the first embodiment is used, the electrodes have the three-layer structure as the whole touch sensor 10, and the number of electrode layers can be decreased compared with the conventional four-layer structure. Therefore, the touch sensor having the translucency higher than that of the conventional configuration can be made. Because the first and second piezoelectricity detecting electrodes 22 and 23 are formed in the region where the electrode is not formed in the position detection sensor 30, the electrodes have a double-layer structure in this region. Accordingly, a difference in color or light transmittance between the region where the electrode is not formed and the region where the electrode is formed can be decreased in the position detection sensor 30. Therefore, the touch sensor having a translucency or hue variation less than that of the conventional configuration can be made.

Figure 4:
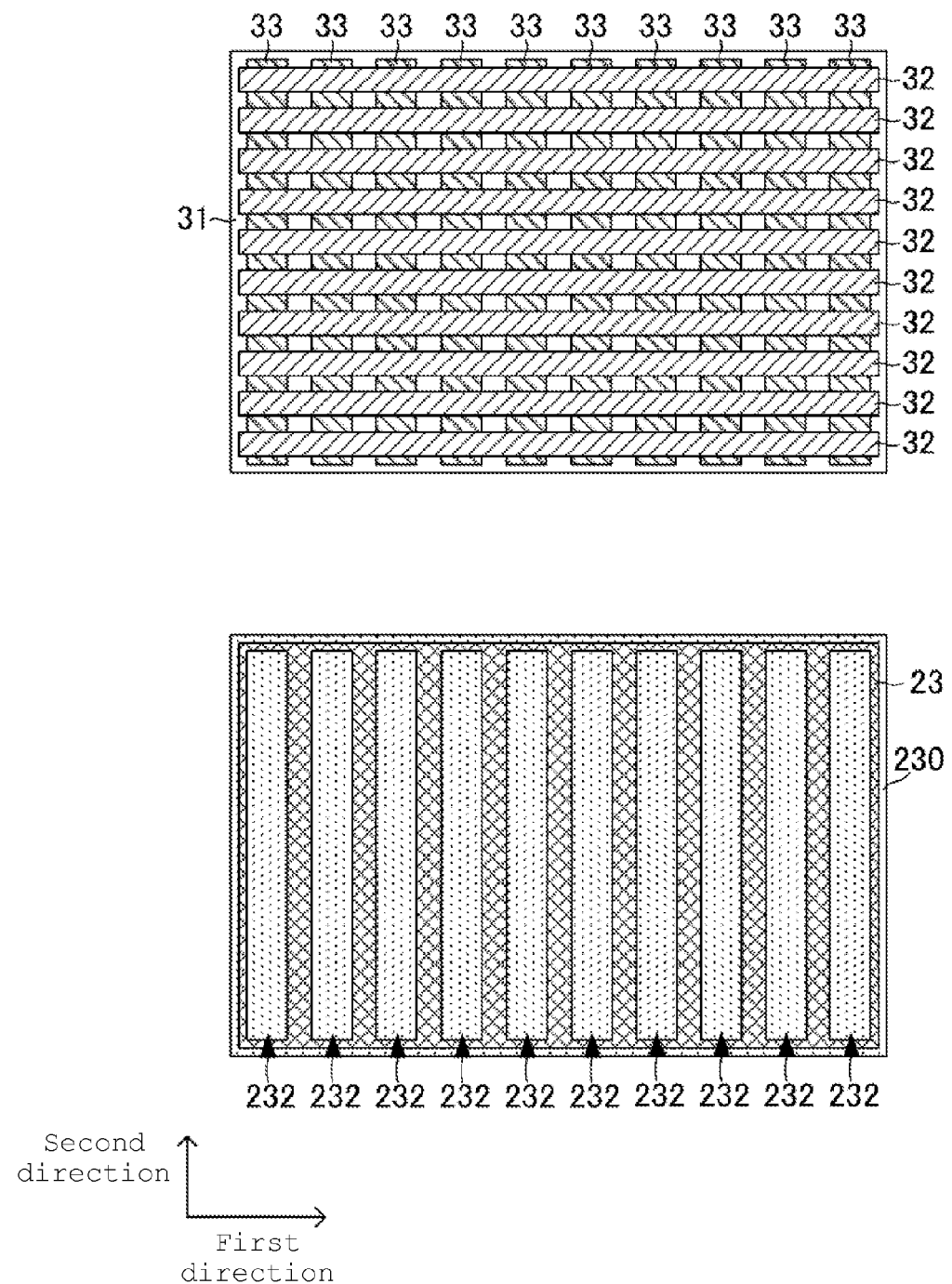
FIG. 4 shows plan views illustrating an electrode pattern in each layer of a touch sensor according to a second embodiment of the present invention.

Hereinafter, a touch sensor according to a second embodiment of the present invention will be described with reference to FIG. 4. FIG. 4 shows plan views illustrating an electrode pattern in each layer of the touch sensor according to the second embodiment of the present invention. The touch sensor of the second embodiment differs from the touch sensor 10 of the first embodiment only in that an electrode non-forming section 232 has a shape different from that of the electrode non-forming section 231 of the touch sensor 10 of the first embodiment. Accordingly, only a point different from the touch sensor 10 of the first embodiment will specifically be described.

The electrode non-forming section 232 is provided in the second piezoelectricity detecting electrode 23 of the second embodiment at a position where the electrode non-forming section 232 overlaps the second position detecting electrode 33 in the thickness direction of the touch sensor. At this point, the second position detecting electrode 33 is formed such that the resistance of the second position detecting electrode 33 is lower than that of the first position detecting electrode 32. For example, the second position detecting electrode 33 is formed wider or thicker than the first position detecting electrode 32. Particularly, when the second position detecting electrode 33 is formed thicker than the first position detecting electrode 32, the second position detecting electrode 33 has translucency lower than that of the first position detecting electrode 32.

When the configuration of the second embodiment is used, the second position detecting electrode 33 that has the translucency lower than that of the first position detecting electrode 32 does not overlap the second piezoelectricity detecting electrode 23. Therefore, the light transmittance can be improved in the region where the second position detecting electrode 33 is formed. Additionally, because the first position detecting electrode 32 and the second piezoelectricity detecting electrode 23 overlap each other, the difference in light transmittance can be decreased between the region where the first position detecting electrode 32 is formed and the region where the second position detecting electrode 33 is formed, and the touch sensor having a less variation in translucency or hue can be made.

Figure 5:
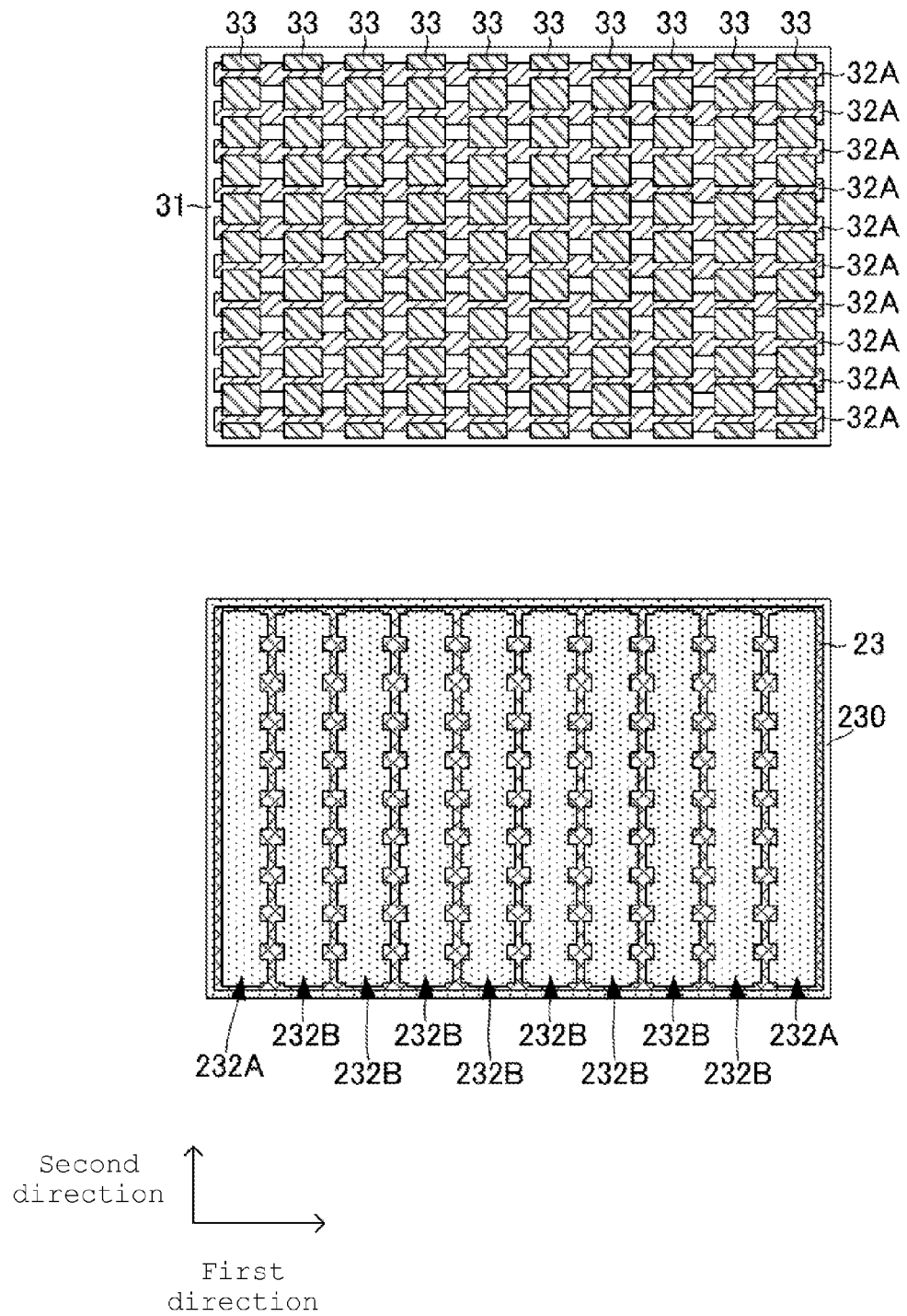
FIG. 5 shows plan views illustrating an electrode pattern in each layer of a touch sensor according to a third embodiment of the present invention.

Hereinafter, a touch sensor according to a third embodiment of the present invention will be described with reference to FIG. 5. FIG. 5 shows plan view illustrating an electrode pattern in each layer of the touch sensor according to the third embodiment of the present invention. The touch sensor of the third embodiment differs from the touch sensor of the second embodiment in that a first position detecting electrode 32A has a shape different from that of the first position detecting electrode 32 and that electrode non-forming sections 232A and 232B in the second piezoelectricity detecting electrode 23 have shapes different from that of the electrode non-forming section 232. Accordingly, only a point different from the touch sensor of the second embodiment will specifically be described.

In the first position detecting electrode 32A of the third embodiment, the width of a region where the first position detecting electrode 32A overlaps the second position detecting electrode 33 in the thickness direction of the touch sensor is narrower than the width of a region where the first position detecting electrode 32A does not overlap the second position detecting electrode 33 in the thickness direction of the touch sensor. Therefore, an overlapping region where the first position detecting electrode 32A and the second position detecting electrode 33 overlap each other can be reduced. Accordingly, an area of a low-light-transmittance region can be reduced.

Because the first position detecting electrode 32A may have the resistance higher than that of the second position detecting electrode 33 as described above, position detection sensitivity is hardly degraded even if the width of the first position detecting electrode 32A is partially narrowed.

The electrode non-forming sections 232A and 232B in the second piezoelectricity detecting electrode 23 of the third embodiment have the shapes expanded to a region of the first position detecting electrode 32A that overlaps the second position detecting electrode 33 in the thickness direction of the touch sensor, and to a partial region of the first position detecting electrode 32A next to the overlapping region. In the configuration, the partial region of the first position detecting electrode 32A does not overlap the second piezoelectricity detecting electrode 23. Therefore, light transmittance can be improved in the partial region of the first position detecting electrode 32A.

A narrow region where the electrode is formed is provided between the electrode non-forming sections 232B adjacent to each other. Therefore, the second piezoelectricity detecting electrode 23 has no independent region that is not electrically connected to other electrode forming regions, so that the charge detection can be implemented only by one electrode pattern while high translucency is obtained. Accordingly, necessity to provide routing for an independent electrode can be eliminated to simplify the external output electrode pattern.

In the above embodiments, by way of example, the electrode non-forming section is provided in the second piezoelectricity detecting electrode 23. Alternatively, the electrode non-forming section may be provided in the first piezoelectricity detecting electrode 22. However, it is more preferable that the electrode non-forming section is provided in the second piezoelectricity detecting electrode 23 formed on the insulating base film 230. This is because the electrode non-forming section 231 can easily be provided by patterning and etching performed on the conventional resin film equipped with the electrode in the case that the electrode non-forming section 231 is provided while the second piezoelectricity detecting electrode 23 is formed on the insulating base film 230. Another reason is that the patterning and etching does not need to be performed on the electrode formed on the piezoelectric film 21 and the degradation of the piezoelectric film 21 can be prevented.

In the embodiments, by way of example, the position detection sensor and the pressure detection sensor are arranged in the order from the side of the cover member 40. Alternatively, the position detection sensor and the pressure detection sensor may reversely be arranged.

In the embodiments, by way of example, the hard-coat layer is formed on the first principal surface side of the piezoelectric film to form the first piezoelectricity detecting electrode. However, on the first principal surface side of the piezoelectric film, similarly to the second principal surface side, the first piezoelectricity detecting electrode may be formed on the insulating base film to mount the insulating base film on the piezoelectric film.

DESCRIPTION OF REFERENCE SYMBOLS 1 touch type input device
10 touch sensor
11, 12 adhesive
20 pressure detection sensor
21 piezoelectric film
22 first piezoelectricity detecting electrode
23 second piezoelectricity detecting electrode
210 hard-coat layer
230, 330 insulating base film
231, 232, 232A, 232B electrode non-forming section
30 position detection sensor
31 dielectric substrate
32, 32A first position detecting electrode
33 second position detecting electrode
40 cover member
50 chassis
60 display panel
70 arithmetic circuit module

The invention claimed is:
1. A touch sensor comprising:
a pressure detection sensor that includes a piezoelectric film having a first surface and a second surface, the first surface and the second surface being orthogonal to a thickness direction of the piezoelectric film, a first piezoelectricity detecting electrode adjacent the first surface, and a second piezoelectricity detecting electrode adjacent the second surface; and
an electrostatic position detection sensor that includes a dielectric substrate having a third surface and a fourth surface, the third surface and the fourth surface being orthogonal to a thickness direction of the dielectric substrate, a first position detecting electrode adjacent the third surface, and a second position detecting electrode adjacent the fourth surface,
wherein the pressure detection sensor and the electrostatic position detection sensor are arranged such that the first surface and the second surface are parallel to the third surface and the fourth surface, and
the second piezoelectricity detecting electrode includes an electrode non-forming section at a position where the first position detecting electrode and the second position detecting electrode overlap each other when the pressure detection sensor and the electrostatic position detection sensor are arranged such that the first surface and the second surface are parallel to the third surface and the fourth surface.
2. The touch sensor according to claim 1, wherein the first piezoelectricity detecting electrode is arranged over substantially a whole of the first surface.

3. The touch sensor according to claim 1, wherein the electrode non-forming section includes a first region that overlaps the second position detecting electrode.

4. The touch sensor according to claim 3, wherein the electrode non-forming section includes a second region that overlaps at least a part of the first position detecting electrode.

5. The touch sensor according to claim 4, wherein, in the first position detecting electrode, when the electrostatic type position detection sensor is viewed in the thickness direction of the dielectric substrate, a width of the first region that overlaps the second position detecting electrode is smaller than a width of a third region that does not overlap the second position detecting electrode.

6. The touch sensor according to claim 3, wherein, in the first position detecting electrode, when the electrostatic type position detection sensor is viewed in the thickness direction of the dielectric substrate, a width of the first region that overlaps the second position detecting electrode is smaller than a width of a second region that does not overlap the second position detecting electrode.

7. The touch sensor according to claim 1, further comprising a translucent layer interposed between the first piezoelectricity detecting electrode and the first surface of the piezoelectric film.

8. The touch sensor according to claim 1, wherein the piezoelectric film is polylactic acid stretched in a uniaxial direction.

9. The touch sensor according to claim 1, wherein the second piezoelectricity detecting electrode is in an insulating base film.

10. The touch sensor according to claim 1, wherein the second position detecting electrode is in an insulating base film.

11. The touch sensor according to claim 1, wherein in a region where the first position detecting electrode and the second position detecting electrode do not overlap each other, the touch sensor has a three-layer electrode structure in a thickness direction of the touch sensor.

12. The touch sensor according to claim 1, wherein a resistance of the second position detecting electrode is lower than that of the first position detecting electrode.

* * * * *